(12) United States Patent
Lin et al.

(10) Patent No.: US 11,043,462 B2
(45) Date of Patent: Jun. 22, 2021

(54) SOLDERLESS INTERCONNECTION STRUCTURE AND METHOD OF FORMING SAME

(71) Applicant: Taiwan Semiconductor Manufacturing Company, Ltd., Hsinchu (TW)

(72) Inventors: Yu-Wei Lin, New Taipei (TW); Sheng-Yu Wu, Hsinchu (TW); Yu-Jen Tseng, Hsin-Chu (TW); Tin-Hao Kuo, Hsinchu (TW); Chen-Shien Chen, Zhubei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 16/436,626

(22) Filed: Jun. 10, 2019

(65) Prior Publication Data
US 2019/0295971 A1    Sep. 26, 2019

Related U.S. Application Data

(60) Continuation of application No. 15/351,184, filed on Nov. 14, 2016, now Pat. No. 10,319,691, which is a
(Continued)

(51) Int. Cl.
*H01L 25/16*   (2006.01)
*H01L 21/48*   (2006.01)
(Continued)

(52) U.S. Cl.
CPC .......... *H01L 24/02* (2013.01); *H01L 21/4853* (2013.01); *H01L 21/76885* (2013.01);
(Continued)

(58) Field of Classification Search
CPC ..... H01L 21/48; H01L 21/4853; H01L 21/76; H01L 21/76885; H01L 24/02;
(Continued)

(56) References Cited

U.S. PATENT DOCUMENTS

| 4,258,382 A | 3/1981 | Harris |
| 4,536,421 A | 8/1985 | Matsuzawa et al. |

(Continued)

FOREIGN PATENT DOCUMENTS

| CN | 101080138 A | 11/2007 |
| CN | 101188219 A | 5/2008 |

(Continued)

OTHER PUBLICATIONS

Garrou, Phil, "IFTLE 58 Fine Pitch Microjoints, Cu Pillar Bump-on-Lead, Xillinx Interposer Reliability," Solid State Technology, Insights for Electronic Manufacturing, Jul. 18, 2011, 3 pages.

*Primary Examiner* — Fazli Erdem
(74) *Attorney, Agent, or Firm* — Slater Matsil, LLP

(57) ABSTRACT

An embodiment bump on trace (BOT) structure includes a contact element supported by an integrated circuit, an under bump metallurgy (UBM) feature electrically coupled to the contact element, a metal ladder bump mounted on the under bump metallurgy feature, the metal ladder bump having a first tapering profile, and a substrate trace mounted on a substrate, the substrate trace having a second tapering profile and coupled to the metal ladder bump through direct metal-to-metal bonding. An embodiment chip-to-chip structure may be fabricated in a similar fashion.

20 Claims, 5 Drawing Sheets

Related U.S. Application Data division of application No. 13/744,361, filed on Jan. 17, 2013, now Pat. No. 9,496,233.

(60) Provisional application No. 61/707,609, filed on Sep. 28, 2012, provisional application No. 61/707,644, filed on Sep. 28, 2012, provisional application No. 61/707,442, filed on Sep. 28, 2012, provisional application No. 61/702,624, filed on Sep. 18, 2012.

(51) Int. Cl.
| | | |
|---|---|---|
| *H01L 23/00* | (2006.01) | |
| *H01L 21/768* | (2006.01) | |
| *H01L 25/065* | (2006.01) | |
| *H01L 25/00* | (2006.01) | |
| H01L 23/498 | (2006.01) | |

(52) U.S. Cl.
CPC ............. *H01L 24/11* (2013.01); *H01L 24/13* (2013.01); *H01L 24/16* (2013.01); *H01L 24/81* (2013.01); *H01L 25/0657* (2013.01); *H01L 25/50* (2013.01); H01L 23/49811 (2013.01); H01L 24/05 (2013.01); H01L 24/14 (2013.01); H01L 2224/0215 (2013.01); H01L 2224/02125 (2013.01); H01L 2224/02141 (2013.01); H01L 2224/02145 (2013.01); H01L 2224/0401 (2013.01); H01L 2224/05114 (2013.01); H01L 2224/05124 (2013.01); H01L 2224/05147 (2013.01); H01L 2224/05155 (2013.01); H01L 2224/05647 (2013.01); H01L 2224/10125 (2013.01); H01L 2224/1112 (2013.01); H01L 2224/11013 (2013.01); H01L 2224/11019 (2013.01); H01L 2224/11462 (2013.01); H01L 2224/11472 (2013.01); H01L 2224/13005 (2013.01); H01L 2224/136 (2013.01); H01L 2224/1308 (2013.01); H01L 2224/13012 (2013.01); H01L 2224/13015 (2013.01); H01L 2224/13017 (2013.01); H01L 2224/13023 (2013.01); H01L 2224/13026 (2013.01); H01L 2224/1357 (2013.01); H01L 2224/1369 (2013.01); H01L 2224/13082 (2013.01); H01L 2224/13083 (2013.01); H01L 2224/13111 (2013.01); H01L 2224/13116 (2013.01); H01L 2224/13144 (2013.01); H01L 2224/13147 (2013.01); H01L 2224/13155 (2013.01); H01L 2224/13164 (2013.01); H01L 2224/13166 (2013.01); H01L 2224/13551 (2013.01); H01L 2224/13564 (2013.01); H01L 2224/13565 (2013.01); H01L 2224/13582 (2013.01); H01L 2224/13686 (2013.01); H01L 2224/14051 (2013.01); H01L 2224/16148 (2013.01); H01L 2224/16227 (2013.01); H01L 2224/16238 (2013.01); H01L 2224/16503 (2013.01); H01L 2224/81007 (2013.01); H01L 2224/8181 (2013.01); H01L 2224/8192 (2013.01); H01L 2224/81143 (2013.01); H01L 2224/81191 (2013.01); H01L 2224/81203 (2013.01); H01L 2224/81424 (2013.01); H01L 2224/81439 (2013.01); H01L 2224/81444 (2013.01); H01L 2224/81447 (2013.01); H01L 2224/81895 (2013.01); H01L 2224/81948 (2013.01); H01L 2225/06513 (2013.01); H01L 2924/04941 (2013.01); H01L 2924/07025 (2013.01); H01L 2924/181 (2013.01); H01L 2924/301 (2013.01); H01L 2924/35 (2013.01); Y10T 29/49144 (2015.01)

(58) Field of Classification Search
CPC ......... H01L 24/11; H01L 24/13; H01L 24/16; H01L 24/82; H01L 24/86; H01L 25/06; H01L 25/0657; H01L 25/50
USPC ........................................................ 438/108
See application file for complete search history.

(56) References Cited

U.S. PATENT DOCUMENTS

| | | |
|---|---|---|
| 4,811,082 A | 3/1989 | Jacobs et al. |
| 4,830,723 A | 5/1989 | Galvagni et al. |
| 4,990,462 A | 2/1991 | Sliwa, Jr. |
| 5,075,253 A | 12/1991 | Sliwa, Jr. |
| 5,075,965 A | 12/1991 | Carey et al. |
| 5,130,779 A | 7/1992 | Agarwala et al. |
| 5,134,460 A | 7/1992 | Brady et al. |
| 5,277,756 A | 1/1994 | Dion |
| 5,334,804 A | 8/1994 | Love et al. |
| 5,380,681 A | 1/1995 | Hsu |
| 5,431,328 A | 7/1995 | Chang et al. |
| 5,440,239 A | 8/1995 | Zappella et al. |
| 5,470,787 A | 11/1995 | Greer |
| 5,481,133 A | 1/1996 | Hsu |
| 5,492,266 A | 2/1996 | Hoebener et al. |
| 5,508,561 A | 4/1996 | Tago et al. |
| 5,542,601 A | 8/1996 | Fallon et al. |
| 5,565,379 A | 10/1996 | Baba |
| 5,587,337 A | 12/1996 | Idaka et al. |
| 5,680,187 A | 10/1997 | Nagayama et al. |
| 5,743,006 A | 4/1998 | Beratan |
| 5,790,377 A | 8/1998 | Schreiber et al. |
| 5,796,591 A | 8/1998 | Dalal et al. |
| 5,796,592 A | 8/1998 | Tanaka |
| 5,816,478 A | 10/1998 | Kaskoun et al. |
| 5,889,326 A | 3/1999 | Tanaka |
| 5,922,496 A | 7/1999 | Dalal et al. |
| 5,977,599 A | 11/1999 | Adrian |
| 6,002,172 A | 12/1999 | Desai et al. |
| 6,002,177 A | 12/1999 | Gaynes et al. |
| 6,025,650 A | 2/2000 | Tsuji et al. |
| 6,051,273 A | 4/2000 | Dalal et al. |
| 6,082,610 A | 7/2000 | Shangguan et al. |
| 6,091,141 A | 7/2000 | Heo |
| 6,099,935 A | 8/2000 | Brearley et al. |
| 6,130,476 A | 10/2000 | LaFontaine, Jr. et al. |
| 6,137,184 A * | 10/2000 | Ikegami ............. H01L 21/4853 257/785 |
| 6,181,010 B1 | 1/2001 | Nozawa |
| 6,187,678 B1 | 2/2001 | Gaynes et al. |
| 6,229,216 B1 | 5/2001 | Ma et al. |
| 6,229,220 B1 | 5/2001 | Saitoh et al. |
| 6,236,115 B1 | 5/2001 | Gaynes et al. |
| 6,249,051 B1 | 6/2001 | Chang et al. |
| 6,250,541 B1 | 6/2001 | Shangguan et al. |
| 6,259,159 B1 | 7/2001 | Dalal et al. |
| 6,271,059 B1 | 8/2001 | Bertin et al. |
| 6,279,815 B1 | 8/2001 | Correia et al. |
| 6,291,891 B1 | 9/2001 | Higashi et al. |
| 6,336,262 B1 | 1/2002 | Dalal et al. |
| 6,344,234 B1 | 2/2002 | Dalal et al. |
| 6,346,469 B1 | 2/2002 | Greer |
| 6,355,501 B1 | 3/2002 | Fung et al. |
| 6,358,847 B1 | 3/2002 | Li et al. |
| 6,388,322 B1 | 5/2002 | Goossen et al. |
| 6,424,037 B1 | 7/2002 | Ho et al. |
| 6,426,556 B1 | 7/2002 | Lin |
| 6,434,016 B2 | 8/2002 | Zeng et al. |
| 6,448,661 B1 | 9/2002 | Kim et al. |
| 6,461,895 B1 | 10/2002 | Liang et al. |
| 6,469,394 B1 | 10/2002 | Wong et al. |
| 6,475,897 B1 | 11/2002 | Hosaka |
| 6,476,503 B1 | 11/2002 | Imamura |
| 6,492,197 B1 | 12/2002 | Rinne |
| 6,498,308 B2 | 12/2002 | Sakamoto |
| 6,562,653 B1 | 5/2003 | Ma et al. |
| 6,562,657 B1 | 5/2003 | Lin |

(56) References Cited

U.S. PATENT DOCUMENTS

| | | |
|---|---|---|
| 6,570,248 B1 | 5/2003 | Ahn et al. |
| 6,573,598 B2 | 6/2003 | Ohuchi et al. |
| 6,578,754 B1 | 6/2003 | Tung |
| 6,583,846 B1 | 6/2003 | Yanagawa et al. |
| 6,592,019 B2 | 7/2003 | Tung |
| 6,600,222 B1 | 7/2003 | Levardo |
| 6,607,938 B2 | 8/2003 | Kwon et al. |
| 6,661,085 B2 | 12/2003 | Kellar et al. |
| 6,713,844 B2 | 3/2004 | Tatsuta |
| 6,731,003 B2 | 5/2004 | Joshi et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,940,169 B2 | 9/2005 | Jin et al. |
| 6,940,178 B2 | 9/2005 | Kweon et al. |
| 6,943,067 B2 | 9/2005 | Greenlaw |
| 6,946,384 B2 | 9/2005 | Kloster et al. |
| 6,972,490 B2 | 12/2005 | Chang et al. |
| 6,975,016 B2 | 12/2005 | Kellar et al. |
| 6,998,216 B2 | 2/2006 | He et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,135,766 B1 | 11/2006 | Costa et al. |
| 7,151,009 B2 | 12/2006 | Kim et al. |
| 7,157,787 B2 | 1/2007 | Kim et al. |
| 7,192,803 B1 | 3/2007 | Lin et al. |
| 7,215,033 B2 | 5/2007 | Lee et al. |
| 7,245,023 B1 | 7/2007 | Lin |
| 7,251,484 B2 | 7/2007 | Aslanian |
| 7,271,483 B2 | 9/2007 | Lin et al. |
| 7,271,484 B2 | 9/2007 | Reiss et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | William et al. |
| 7,320,928 B2 | 1/2008 | Kloster et al. |
| 7,345,350 B2 | 3/2008 | Sinha |
| 7,382,049 B2 | 6/2008 | Ho et al. |
| 7,402,442 B2 | 7/2008 | Condorelli et al. |
| 7,402,508 B2 | 7/2008 | Kaneko |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,459,785 B2 | 12/2008 | Daubenspeck et al. |
| 7,470,996 B2 | 12/2008 | Yoneyama et al. |
| 7,494,845 B2 | 2/2009 | Hwang et al. |
| 7,495,179 B2 | 2/2009 | Kubota et al. |
| 7,528,494 B2 | 5/2009 | Furukawa et al. |
| 7,531,890 B2 | 5/2009 | Kim |
| 7,554,201 B2 | 6/2009 | Kang et al. |
| 7,557,597 B2 | 7/2009 | Anderson et al. |
| 7,569,935 B1 | 8/2009 | Fan |
| 7,576,435 B2 | 8/2009 | Chao |
| 7,659,631 B2 | 2/2010 | Kamins et al. |
| 7,714,235 B1 | 5/2010 | Pedersen et al. |
| 7,804,177 B2 | 9/2010 | Lu et al. |
| 7,834,450 B2 | 11/2010 | Kang |
| 7,939,939 B1 | 5/2011 | Zeng et al. |
| 7,946,331 B2 | 5/2011 | Trezza et al. |
| 8,026,128 B2 | 9/2011 | Pendse |
| 8,076,232 B2 | 12/2011 | Pendse |
| 8,093,729 B2 | 1/2012 | Trezza |
| 8,120,175 B2 | 2/2012 | Farooq et al. |
| 8,130,475 B2 | 3/2012 | Kawamori et al. |
| 8,158,489 B2 | 4/2012 | Huang et al. |
| 8,207,604 B2 | 6/2012 | Haba et al. |
| 8,232,640 B2 | 7/2012 | Tomoda et al. |
| 8,258,055 B2 | 9/2012 | Hwang et al. |
| 8,313,213 B2 | 11/2012 | Lin et al. |
| 8,367,939 B2 | 2/2013 | Ishido |
| 8,435,881 B2 | 5/2013 | Choi et al. |
| 8,536,458 B1 | 9/2013 | Darveaux et al. |
| 8,576,368 B2 | 11/2013 | Kim et al. |
| 8,823,166 B2 | 9/2014 | Lin et al. |
| 9,105,530 B2 | 8/2015 | Lin et al. |
| 9,355,980 B2 | 5/2016 | Chen et al. |
| 9,425,136 B2 | 8/2016 | Kuo et al. |
| 9,496,233 B2 | 11/2016 | Lin et al. |
| 9,583,687 B2 | 2/2017 | Hwang |
| 2001/0013423 A1 | 8/2001 | Dalal et al. |
| 2001/0038147 A1 | 11/2001 | Higashi et al. |
| 2002/0033412 A1 | 3/2002 | Tung |
| 2002/0084528 A1 | 7/2002 | Kim et al. |
| 2002/0100974 A1 | 8/2002 | Uchiyama |
| 2002/0106832 A1 | 8/2002 | Hotchkiss et al. |
| 2002/0197811 A1 | 12/2002 | Sato |
| 2003/0049886 A1 | 3/2003 | Salmon |
| 2003/0092219 A1 | 5/2003 | Ohuchi et al. |
| 2003/0094963 A1 | 5/2003 | Fang |
| 2003/0166331 A1 | 9/2003 | Tong et al. |
| 2003/0216025 A1 | 11/2003 | Lu et al. |
| 2003/0218250 A1 | 11/2003 | Kung et al. |
| 2003/0233133 A1 | 12/2003 | Greenberg et al. |
| 2004/0004284 A1 | 1/2004 | Lee et al. |
| 2004/0007779 A1 | 1/2004 | Arbuthnot et al. |
| 2004/0140538 A1 | 7/2004 | Harvey |
| 2004/0159944 A1 | 8/2004 | Datta et al. |
| 2004/0166661 A1 | 8/2004 | Lei |
| 2004/0212098 A1 | 10/2004 | Pendse |
| 2004/0251546 A1 | 12/2004 | Lee et al. |
| 2005/0017376 A1 | 1/2005 | Tsai |
| 2005/0062153 A1 | 3/2005 | Saito et al. |
| 2005/0158900 A1 | 7/2005 | Lee |
| 2005/0212114 A1 | 9/2005 | Kawano et al. |
| 2005/0224991 A1 | 10/2005 | Yeo |
| 2005/0253264 A1 | 11/2005 | Aiba et al. |
| 2005/0277283 A1 | 12/2005 | Lin et al. |
| 2006/0012024 A1 | 1/2006 | Lin et al. |
| 2006/0017160 A1 | 1/2006 | Huang |
| 2006/0038303 A1 | 2/2006 | Sterrett et al. |
| 2006/0051954 A1 | 3/2006 | Lin et al. |
| 2006/0055032 A1 | 3/2006 | Chang et al. |
| 2006/0076677 A1 | 4/2006 | Daubenspeck et al. |
| 2006/0209245 A1 | 9/2006 | Mun et al. |
| 2006/0223313 A1 | 10/2006 | Yoon et al. |
| 2006/0279881 A1 | 12/2006 | Sato |
| 2006/0292824 A1 | 12/2006 | Beyne et al. |
| 2007/0001280 A1 | 1/2007 | Hua |
| 2007/0012337 A1 | 1/2007 | Hillman et al. |
| 2007/0018294 A1 | 1/2007 | Sutardja |
| 2007/0020906 A1 | 1/2007 | Chiu et al. |
| 2007/0023483 A1 | 2/2007 | Yoneyama et al. |
| 2007/0045840 A1 | 3/2007 | Varnau |
| 2007/0057022 A1 | 3/2007 | Mogami et al. |
| 2007/0114663 A1 | 5/2007 | Brown et al. |
| 2007/0200234 A1 | 8/2007 | Gerber et al. |
| 2008/0003402 A1 | 1/2008 | Haba et al. |
| 2008/0003715 A1 | 1/2008 | Lee |
| 2008/0023850 A1 | 1/2008 | Lu et al. |
| 2008/0087998 A1 | 4/2008 | Kamins |
| 2008/0128911 A1 | 6/2008 | Koyama |
| 2008/0150135 A1 | 6/2008 | Oyama et al. |
| 2008/0169544 A1 | 7/2008 | Tanaka et al. |
| 2008/0180376 A1 | 7/2008 | Kim et al. |
| 2008/0194095 A1 | 8/2008 | Daubenspeck et al. |
| 2008/0217047 A1 | 9/2008 | Hu |
| 2008/0218061 A1 | 9/2008 | Chao et al. |
| 2008/0277785 A1 | 11/2008 | Hwan et al. |
| 2009/0025215 A1 | 1/2009 | Murakami et al. |
| 2009/0042144 A1 | 2/2009 | Kitada et al. |
| 2009/0045499 A1 | 2/2009 | Kim et al. |
| 2009/0075469 A1 | 3/2009 | Furman et al. |
| 2009/0087143 A1 | 4/2009 | Jeon |
| 2009/0091024 A1 | 4/2009 | Zeng et al. |
| 2009/0096092 A1 | 4/2009 | Patel |
| 2009/0108443 A1 | 4/2009 | Jiang |
| 2009/0146316 A1 | 6/2009 | Jadhav et al. |
| 2009/0149016 A1* | 6/2009 | Park .............. H01L 24/11 438/614 |
| 2009/0166861 A1 | 7/2009 | Lehr et al. |

(56) References Cited

U.S. PATENT DOCUMENTS

| | | |
|---|---|---|
| 2009/0174067 A1 | 7/2009 | Lin |
| 2009/0218702 A1 | 9/2009 | Beyne et al. |
| 2009/0233436 A1 | 9/2009 | Kim et al. |
| 2009/0250814 A1 | 10/2009 | Pendse et al. |
| 2010/0007019 A1 | 1/2010 | Pendse |
| 2010/0044860 A1 | 2/2010 | Haba et al. |
| 2010/0052473 A1 | 3/2010 | Kimura |
| 2010/0084763 A1 | 4/2010 | Yu |
| 2010/0141880 A1 | 6/2010 | Koito et al. |
| 2010/0193944 A1 | 8/2010 | Castro et al. |
| 2010/0200279 A1 | 8/2010 | Kariya et al. |
| 2010/0252926 A1 | 10/2010 | Kato et al. |
| 2010/0258950 A1 | 10/2010 | Li et al. |
| 2010/0270458 A1 | 10/2010 | Lake et al. |
| 2010/0276787 A1 | 11/2010 | Yu et al. |
| 2010/0314745 A1 | 12/2010 | Masumoto et al. |
| 2010/0327422 A1 | 12/2010 | Lee et al. |
| 2011/0001250 A1 | 1/2011 | Lin et al. |
| 2011/0024902 A1 | 2/2011 | Lin et al. |
| 2011/0038147 A1 | 2/2011 | Lin et al. |
| 2011/0074022 A1 | 3/2011 | Pendse |
| 2011/0084386 A1 | 4/2011 | Pendse |
| 2011/0101519 A1 | 5/2011 | Hsiao et al. |
| 2011/0101526 A1 | 5/2011 | Hsiao et al. |
| 2011/0169158 A1 | 7/2011 | Varanasi |
| 2011/0177686 A1 | 7/2011 | Zeng et al. |
| 2011/0186986 A1 | 8/2011 | Chuang et al. |
| 2011/0193220 A1 | 8/2011 | Kuo et al. |
| 2011/0227219 A1 | 9/2011 | Alvarado et al. |
| 2011/0244675 A1 | 10/2011 | Huang et al. |
| 2011/0248399 A1 | 10/2011 | Pendse |
| 2011/0260317 A1 | 10/2011 | Lu et al. |
| 2011/0285011 A1 | 11/2011 | Hwang et al. |
| 2011/0285023 A1 | 11/2011 | Shen et al. |
| 2012/0007230 A1 | 1/2012 | Hwang et al. |
| 2012/0007231 A1 | 1/2012 | Chang |
| 2012/0007232 A1 | 1/2012 | Haba |
| 2012/0012997 A1 | 1/2012 | Shen et al. |
| 2012/0025365 A1* | 2/2012 | Haba ............... H01L 21/4853 257/692 |
| 2012/0040524 A1* | 2/2012 | Kuo ............... H01L 24/13 438/614 |
| 2012/0049346 A1 | 3/2012 | Lin et al. |
| 2012/0091577 A1 | 4/2012 | Hwang et al. |
| 2012/0098120 A1 | 4/2012 | Yu et al. |
| 2012/0098124 A1* | 4/2012 | Wu ............... H01L 24/11 257/737 |
| 2012/0145442 A1 | 6/2012 | Gupta et al. |
| 2012/0146168 A1 | 6/2012 | Hsieh et al. |
| 2012/0223428 A1* | 9/2012 | Pendse ............... H01L 23/49811 257/737 |
| 2012/0306080 A1 | 12/2012 | Yu et al. |
| 2013/0026622 A1 | 1/2013 | Chuang et al. |
| 2013/0026629 A1 | 1/2013 | Nakano |
| 2013/0087920 A1 | 4/2013 | Jeng et al. |
| 2013/0093079 A1 | 4/2013 | Tu et al. |
| 2013/0181340 A1 | 7/2013 | Uehling et al. |
| 2013/0252418 A1 | 9/2013 | Arvin et al. |
| 2013/0270699 A1 | 10/2013 | Kuo et al. |
| 2013/0277830 A1 | 10/2013 | Yu et al. |
| 2013/0288473 A1 | 10/2013 | Chuang et al. |
| 2013/0341785 A1 | 12/2013 | Fu et al. |
| 2014/0048929 A1 | 2/2014 | Cha et al. |
| 2014/0054764 A1 | 2/2014 | Lu et al. |
| 2014/0054769 A1 | 2/2014 | Yoshida et al. |
| 2014/0054770 A1 | 2/2014 | Yoshida et al. |
| 2014/0061897 A1 | 3/2014 | Lin et al. |
| 2014/0061924 A1 | 3/2014 | Chen et al. |
| 2014/0077358 A1 | 3/2014 | Chen et al. |
| 2014/0077359 A1 | 3/2014 | Tsai et al. |
| 2014/0077360 A1 | 3/2014 | Lin et al. |
| 2014/0077365 A1 | 3/2014 | Lin et al. |
| 2014/0117533 A1 | 5/2014 | Lei et al. |
| 2014/0264890 A1 | 9/2014 | Breuer et al. |
| 2014/0346669 A1 | 11/2014 | Wang |
| 2014/0353820 A1 | 12/2014 | Yu et al. |
| 2015/0091160 A1 | 4/2015 | Reber |
| 2015/0325542 A1 | 11/2015 | Lin et al. |
| 2016/0190090 A1 | 6/2016 | Yu et al. |
| 2016/0254240 A1 | 9/2016 | Chen |
| 2016/0329293 A1 | 11/2016 | Cha et al. |

FOREIGN PATENT DOCUMENTS

| | | |
|---|---|---|
| CN | 102254871 A | 11/2011 |
| CN | 102386158 A | 3/2012 |
| CN | 102468197 A | 5/2012 |
| CN | 102543898 A | 7/2012 |
| EP | 1387402 A2 | 2/2004 |
| KR | 1020110002816 A | 1/2011 |
| KR | 1020110128532 A | 11/2011 |
| TW | 200826265 A | 6/2008 |
| TW | 200915452 A | 4/2009 |
| TW | 201133662 A1 | 10/2011 |
| TW | 201143007 A | 12/2011 |
| WO | 2009140238 A3 | 11/2009 |

\* cited by examiner

SOLDERLESS INTERCONNECTION STRUCTURE AND METHOD OF FORMING SAME

PRIORITY CLAIM AND CROSS-REFERENCE

This application is a continuation application of U.S. patent application Ser. No. 15/351,184, filed Nov. 14, 2016, entitled "Solderless Interconnection Structure and Method of Forming Same," which is a divisional application of U.S. patent application Ser. No. 13/744,361, filed Jan. 17, 2013, entitled "Interconnection Structure and Method of Forming Same," which application claims the benefit of U.S. Provisional Application No. 61/707,609, filed on Sep. 28, 2012, entitled "Interconnection Structure Method of Forming Same," of U.S. Provisional Application No. 61/707,644, filed on Sep. 28, 2012, entitled "Metal Bump and Method of Manufacturing Same," of U.S. Provisional Application No. 61/702,624, filed on Sep. 18, 2012, entitled "Ladd Bump Structures and Methods of Making the Same," and of U.S. Provisional Application No. 61/707,442, filed on Sep. 28, 2012, entitled "Bump Structure and Method of Forming Same," which applications are hereby incorporated herein by reference.

BACKGROUND

Generally, the conventional flip chip bumps have vertical or nearly vertical sidewalls and are connected to an underlying trace (such as on a substrate, a printed circuit board, an interposer, another chip, or the like) using a solder reflow process.

The solder joint method forms intermetallic compounds (IMCs) between the metal-solder interface. The IMCs may cause higher electrical resistivity (contact resistance). The higher electrical resistivity leads to increased electromigration, which further increases the contact resistance. In addition, with a small area under bump metallurgy (UBM), the solder/metal electromigration issue may be of greater concern.

As device packaging dimensions shrink, the smaller distance between the bump and an adjacent trace may lead to undesirable bridging during reflow. In addition, as device packaging dimensions shrink interconnect bump sizes also shrink. The reduction in bump size has led to an increase in interconnect resistance and capacitance (RC) that is the cause of signal transmission delay (RC delay). Smaller bump sizes also increases the risk of extremely low-k (ELK) dielectric delamination.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a ladder bump structure for a bump on trace (BOT) assembly or a flip-chip chip scale package (FCCSP). The concepts in the disclosure may also apply, however, to other semiconductor structures or circuits.

Figure 1:
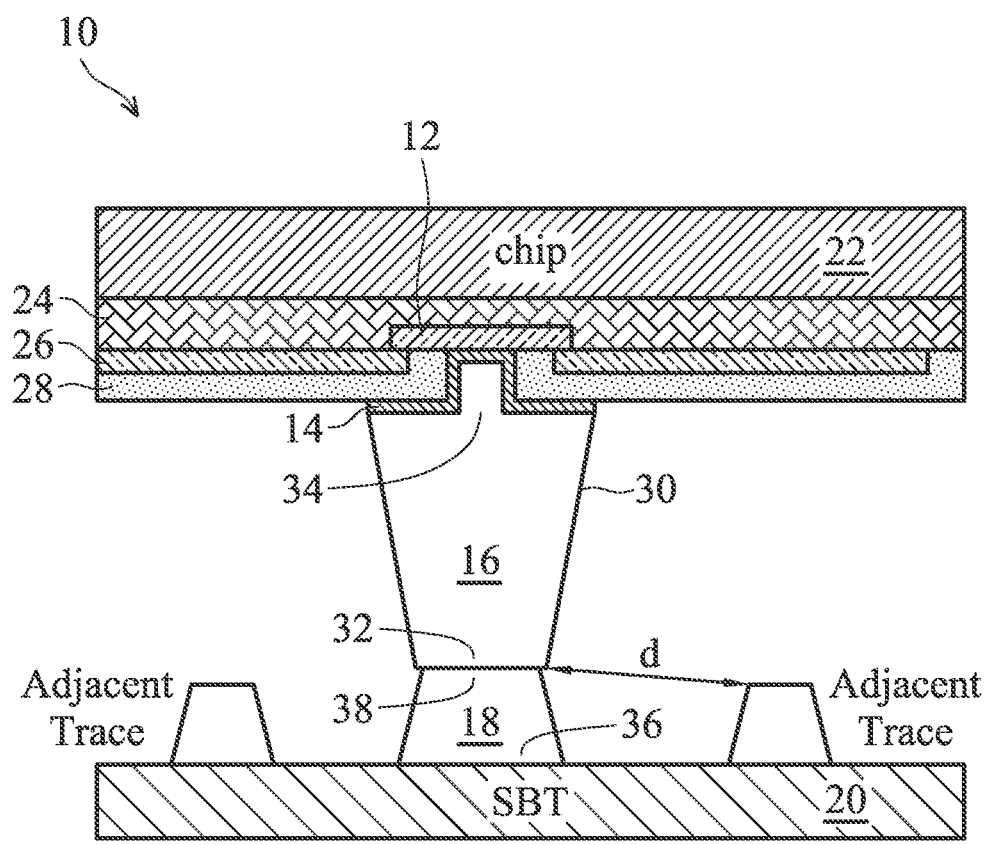
FIG. 1 is a cross sectional view of an embodiment bump on trace (BOT) structure.

Referring now to FIG. 1, an embodiment bump on trace (BOT) structure 10 is illustrated. As shown, the BOT structure 10 includes a contact element 12, an under bump metallurgy (UBM) feature 14, a metal ladder bump 16, a substrate trace 18, and a substrate (SBT) 20. As shown, the contact element 12 is generally supported by the integrated circuit 22 (i.e., chip). In an embodiment, an insulating layer 24 is disposed between the contact element 12 and the integrated circuit 22. In an embodiment, the contact element 12 is an aluminum pad. In an embodiment, the insulating layer 24 comprises an extremely low-k (ELK) dielectric.

In an embodiment, a passivation layer 26 overlies the integrated circuit 22 (and/or the insulating layer 24). As shown in FIG. 1, the passivation layer 26 may have a passivation opening exposing the contact element 12. In an embodiment, a polyimide layer 28 overlies the passivation layer 26. The polyimide layer 28 may have a polyimide opening exposing the contact element 12.

Various layers and features of the integrated circuit 22, including transistors, interconnect layers, post passivation interconnects, redistribution layers, and the like are omitted from the figures for the sake of clarity, as they are not necessary to an understanding of the present disclosure.

Still referring to FIG. 1, the UBM feature 14 is electrically coupled to the contact element 12. In an embodiment, the UBM feature 14 is formed from titanium (Ti), titanium nitride (TiN) copper nickel (CuNi), aluminum (Al), and the like to a thickness of, perhaps, about 0.1 µm to about 5 µm, depending on the application. As shown, various layers including, for example, a passivation layer and a polyimide layer, may be disposed between portions of the UBM feature 14 and the contact element 12.

Still referring to FIG. 1, the metal ladder bump 16 is mounted on the UBM feature 14. In an embodiment, the metal ladder bump 16 has a tapering profile. In an embodiment, the metal ladder bump 16 has a linear tapering profile. Indeed, the metal ladder bump 16 generally has the shape of a truncated cone. In an embodiment, sidewalls 30 of the metal ladder bump 16 are linear from a distal end 32 to a mounted end 34 of the metal ladder bump 16 along an entire height (i.e., or length) of the sidewalls 30 of the metal ladder bump 16.

In an embodiment, the metal ladder bump 16 is formed from a suitable material such as, for example, copper (Cu), nickel (Ni), gold (Au), palladium (Pd), titanium (Ti), and so on, or alloys thereof. The mounted end 34 of the metal ladder bump 16, which is the end closest to the integrated circuit 22, has a greater width than the distal end 32 of the metal ladder bump 16, which is the end furthest from the integrated circuit 22. In an embodiment, the distal end 32 has a width of between about 10 μm to about 80 μm. In an embodiment, the mounted end 34 has a width of between about 20 μm to about 90 μm.

From the foregoing, it should be recognized that the mounted end 34 is wider or larger than the distal end 32. This condition may be satisfied by, for example, making the mounted end 34 of the metal ladder bump 16 larger relative to the distal end 32. This condition may also be satisfied by, for example, making the distal end 32 of the metal ladder bump 16 smaller relative to the mounted end 34.

One skilled in the art will recognize that it is not desirable to increase the pitch between adjacent bumps. This means that the width of the distal end 32 should not be increased beyond design dimensions. Hence, in order to get the truncated cone structure for the metal ladder bump 16, the width of the mounted end 34 should be increased in order to obtain the advantageous structure. The wider width of the mount end 34 may also serve to lessen the possibility of delamination between the metal ladder bump 16 and adjacent layers and may also serve to lessen stress impact on underlying layers such as underlying ELK layers (e.g., insulating layer 24). As shown in FIG. 1, by forming the distal end 32 of the metal ladder bump 16 smaller than the mounted end 34, the distance, d, between the adjacent trace 18 and the bonded substrate trace 18/metal bump 16 is greater to prevent bridging.

In an embodiment, a photolithography process is used to shape the metal ladder bump 16 as shown in FIG. 1. Indeed, in the photolithography process a photoresist may be shaped appropriately in order to produce the metal ladder bump 16 in the form illustrated in FIG. 1. In an embodiment, the metal ladder bump 16 and/or the substrate trace 18 may be formed using an electrolytic plating process.

Still referring to FIG. 1, the substrate trace 18 is generally mounted on the substrate 20. In an embodiment, the substrate trace 18 is formed from copper (Cu), nickel (Ni), gold (Au), aluminum (Al), silver (Ag), and so on, or alloys thereof. As shown, the substrate trace 18 also has a tapering profile. Indeed, a mounted end 36 of the substrate trace 18, which is the end mounted to the substrate 20, has a greater width than a distal end 38 of the substrate trace 18, which is the end furthest from the substrate 20.

In addition to the above, the substrate trace 18 is structurally and electrically coupled to the metal ladder bump 16 through direct metal-to-metal bonding. Indeed, ends of the metal ladder bump 16 and the substrate trace 18 are each free of solder. Because direct metal-to-metal bonding is used instead of solder, the metal ladder bump 16 is operably coupled to the substrate trace without forming any undesirably intermetallic compounds at or proximate the bonded joint. In addition, the absence of solder reduces the potential for undesirably bridging of the substrate trance 18 and/or the metal ladder bump 16 with an adjacent substrate trace 18.

In an embodiment, the direct metal-to-metal bonding process includes several steps. For example, the top portions or surfaces of the metal ladder bump 16 and/or substrate trace 18 are appropriately cleaned to remove debris or contaminants that may detrimentally affect bonding or bonding strength. Thereafter, the metal ladder bump 16 and the substrate trace 18 are aligned with each other. Once aligned, a permanent bonding process such as, for example, a thermo-compression bonding is performed to bond the metal ladder bump 16 to the substrate trace 18. In an embodiment, an annealing step may be performed to increase the bond strength. For example, the metal ladder bump 16 and the substrate trace 18 may be subjected to a temperature of about 100° C. to about 400° C. for about 1 hour to about 2 hours.

Figure 2:
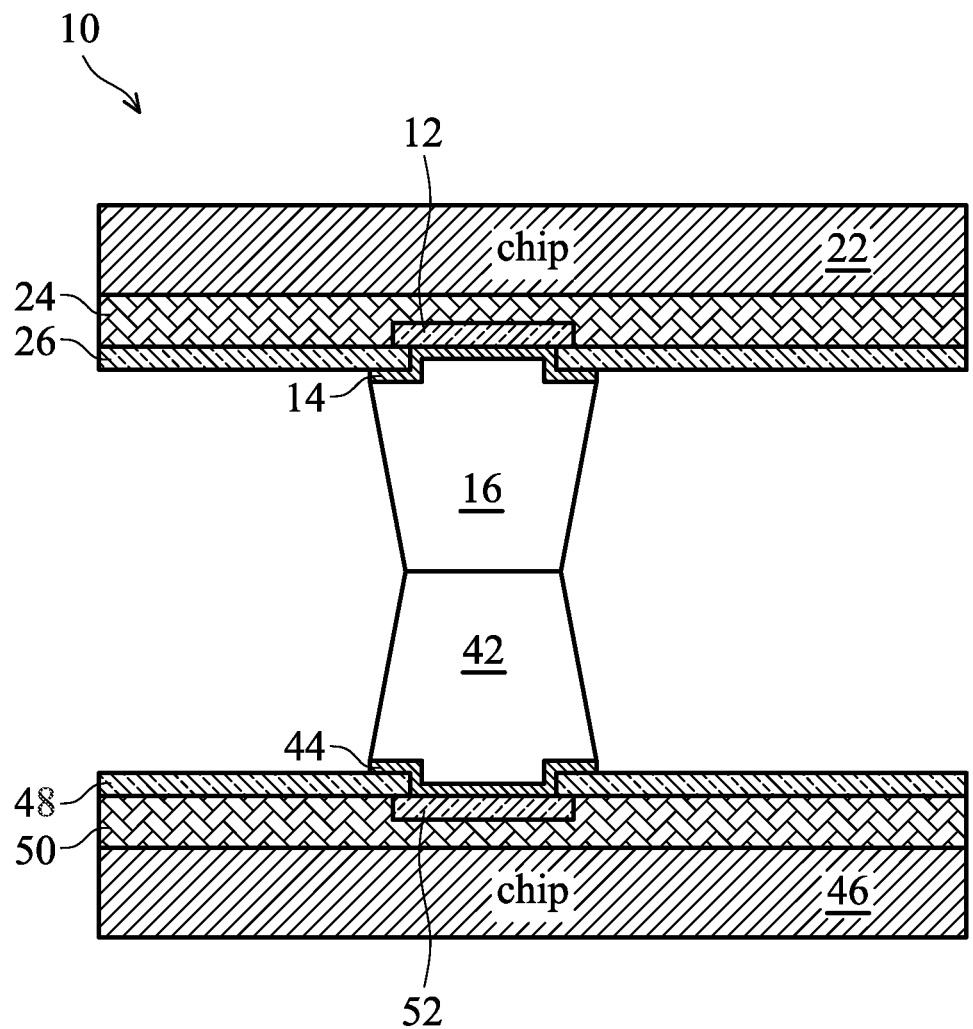
FIG. 2 is a cross sectional view of an embodiment chip-to-chip structure.

Referring now to FIG. 2, an embodiment chip-to-chip structure 40 is illustrated. The chip-to-chip structure 40 is similar to the BOT structure 10 of FIG. 1. However, the chip-to-chip structure 40 of FIG. 2 includes a second metal ladder bump 42 mounted on a second UBM feature 44 of a second integrated circuit 46 instead of the substrate trace 18 on the substrate 20. As shown, the second metal ladder bump 42 also has a tapering profile and is structurally and electrically coupled to the first metal ladder bump 16 through direct metal-to-metal bonding.

In an embodiment, the second integrated circuit 46 includes a second passivation layer 48, a second insulating layer 50 (e.g., ELK dielectric), and a second contact element 52 (e.g., aluminum pad). Various layers and features of the second integrated circuit 46, including transistors, interconnect layers, post passivation interconnects, redistribution layers, and the like are omitted from the figures for the sake of clarity, as they are not necessary to an understanding of the present disclosure. In addition, the second metal ladder bump 42 may be formed in similar fashion and with similar dimensions relative to the metal ladder bump 16 of FIG. 1.

Figure 3:
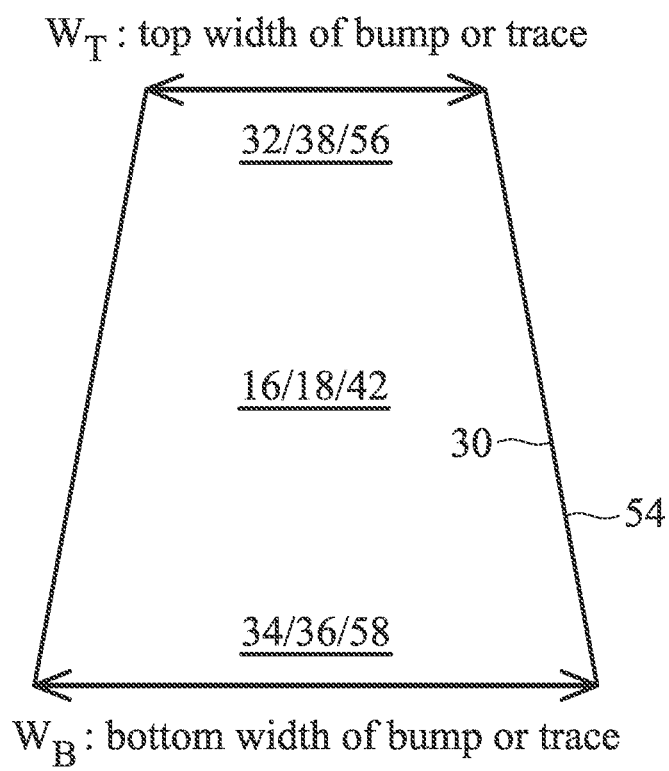
FIG. 3 is a cross section of a metal bump from the BOT structure of FIG. 1 or the chip-to-chip structure of FIG. 2 illustrating a tapering profile and a metal oxide formed on sidewalls.

As shown in FIG. 3, in an embodiment a metal oxide 54 (e.g., cupric oxide, CuO, cuprous oxide, $Cu_2O$, aluminum oxide, $Al_2O_3$, etc.) is formed on the sidewalls 30 of the metal ladder bump 16, substrate trace 18, or second metal ladder bump 42. In an embodiment, a ratio of the width ($W_T$) of the distal end 32 of the metal ladder bump 16 to the width ($W_B$) of the mounted end 34 of the metal ladder bump 16 is between about 0.75 to about 0.97. In an embodiment, a ratio of the width ($W_T$) of the distal end 38 of the substrate trace 18 to the width ($W_B$) of the mounted end 36 of the substrate trace 18 is between about 0.75 to about 0.97. In an embodiment, a ratio of the width ($W_T$) of the distal end 56 of the second metal ladder bump 42 to the width ($W_B$) of the mounted end 58 of the second metal ladder bump 42 is between about 0.75 to about 0.97.

Figure 4:
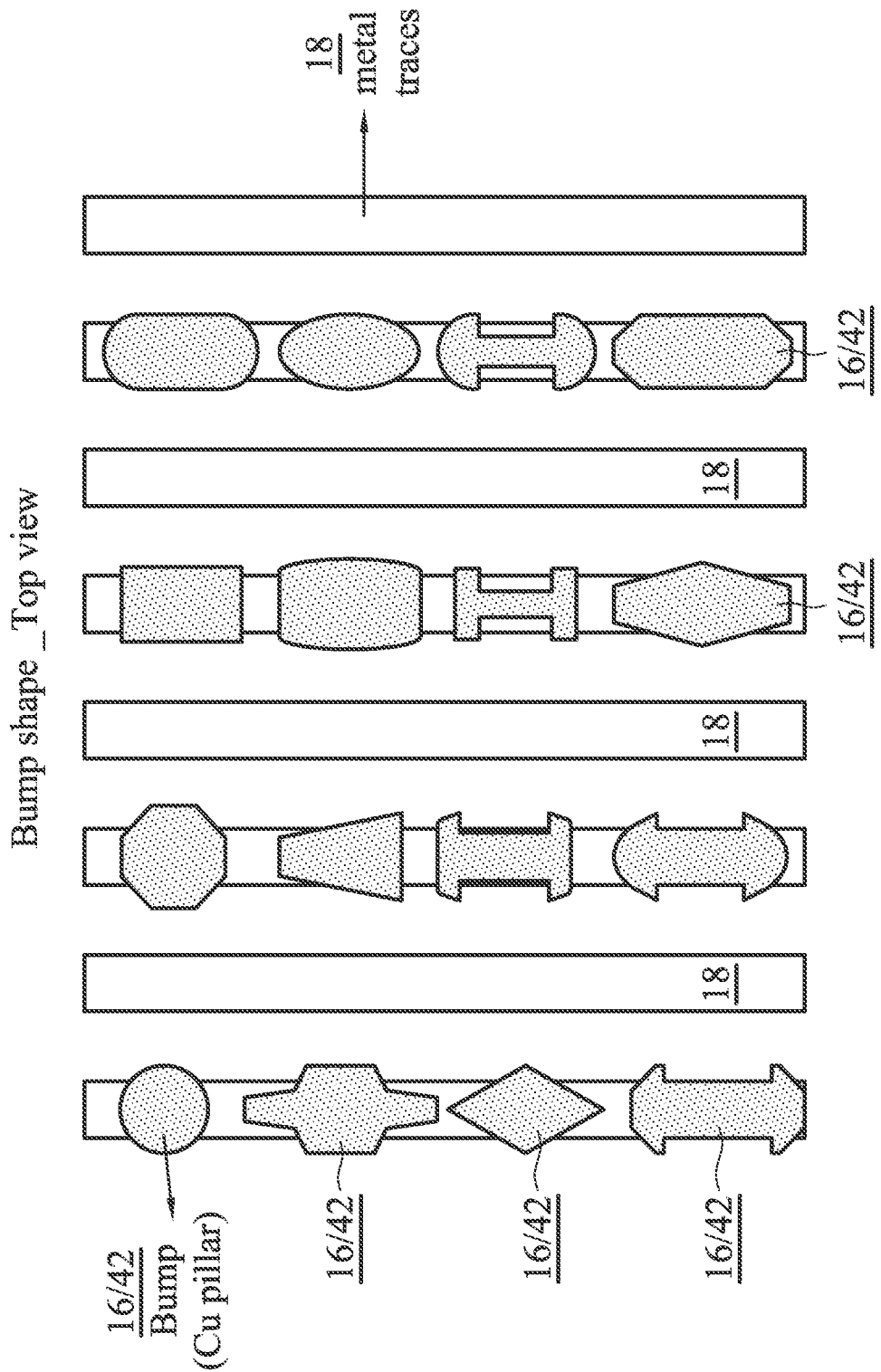
FIG. 4 is a plan view of the metal bump from the BOT structure of FIG. 1 or the chip-to-chip structure of FIG. 2 illustrating various periphery shapes.

As shown in FIG. 4, a periphery of the metal ladder bump 16 (or the second metal ladder bump 42) may take or resemble a variety of different shapes when viewed from above. In an embodiment, the metal ladder bump 16 (or the second metal ladder bump 42) is in the form of a circle, a rectangle, an ellipse, an obround, a hexagon, an octagon, a trapezoid, a diamond, a capsule, and combinations thereof when viewed from the mounted end 34, 58. In FIG. 4, the periphery of the metal ladder bump 16 (or the second metal ladder bump 42) is shown relative to the underlying metal substrate trace 18 (FIG. 1).

One skilled in the art will recognize that the specific dimensions for the various widths and spacing discussed herein are matters of design choice and are dependent upon the particular technology node, and application employed.

Figure 5:
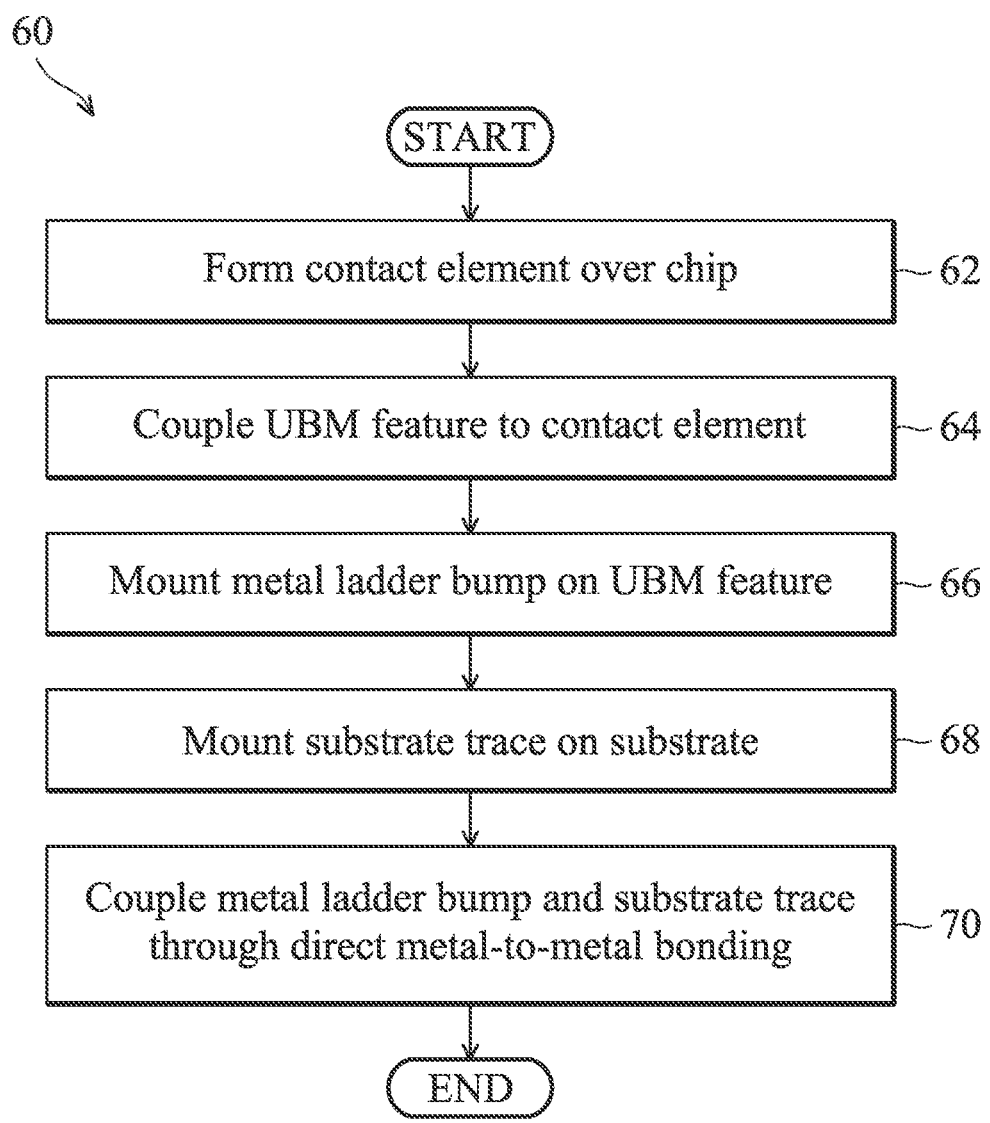
FIG. 5 is a method of forming the BOT structure of FIG. 1.

Referring now to FIG. 5, an embodiment method 60 of forming the BOT structure 10 of FIG. 1 is provided. In block 62, the contact element 12 is formed on the integrated circuit 22. In block 64, the UBM feature is electrically coupled to the contact element 12. Then, in block 66, the metal ladder bump 16 with the tapering profile is mounted on the UBM feature 14. In block 68, the substrate trace 18 with the tapering profile is mounted on the substrate 20. Thereafter, in block 70, the metal ladder bump 16 and the substrate trace 18 are coupled together through direct metal-to-metal bonding as described herein. Those skilled in the art will recognize that the chip-to-chip structure of FIG. 2 may be formed in similar fashion. Therefore, a detailed description of such a method has not been repeated herein for the sake of brevity.

From the foregoing it should be recognized that embodiment BOT structure 10 and chip-to-chip structure 40 provide advantageous features. For example, without having to rely on solder bonding, the BOT structure 10 and chip-to-chip structure 40 are free of any undesirably intermetallic compounds (IMCs). In addition, the BOT structure 10 and chip-to-chip structure 40 provide lower electrical resistivity, lower risk of electromigration failure, and a significantly reduced interconnect RC delay relative to conventional devices. Moreover, the structures 10, 40 inhibit or prevent delamination of the insulating layer 24, 46 (the ELK dielectric). In addition, the smaller top surface area of the metal ladder bump 16, substrate trace 18, and/or second metal ladder bump 42 provide for easier bonding. Still further, the bonding time and the interfacial seam voids may be reduced using the structures 10, 40 and methods disclosed herein.

The following references are related to subject matter of the present application. Each of these references is incorporated herein by reference in its entirety:

U.S. Publication No. 2011/0285023 of Shen, et al. filed on Nov. 24, 2011, entitled "Substrate Interconnections Having Different Sizes."

An embodiment bump on trace (BOT) structure includes a contact element supported by an integrated circuit, an under bump metallurgy (UBM) feature electrically coupled to the contact element, a metal ladder bump mounted on the under bump metallurgy feature, the metal ladder bump having a first tapering profile, and a substrate trace mounted on a substrate, the substrate trace having a second tapering profile and coupled to the metal ladder bump through direct metal-to-metal bonding.

An embodiment chip-to-chip structure includes a first contact element supported by a first integrated circuit, a first under bump metallurgy (UBM) feature electrically coupled to the first contact element, a first metal ladder bump mounted on the first under bump metallurgy feature, the first metal ladder bump having a first tapering profile, and a second metal ladder bump mounted on a second under bump metallurgy feature of a second integrated circuit, the second metal ladder bump having a second tapering profile and coupled to the second metal ladder bump through direct metal-to-metal bonding.

An embodiment method of forming a bump on trace (BOT) structure includes forming a contact element on an integrated circuit, electrically coupling an under bump metallurgy (UBM) feature to the contact element, mounting a metal ladder bump on the under bump metallurgy feature, the metal ladder bump having a first tapering profile, mounting a substrate trace on a substrate, the substrate trace having a second tapering profile, and coupling the metal ladder bump and the substrate trace together through direct metal-to-metal bonding.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising:
   a substrate trace extending along a major surface of a first substrate, the substrate trace having a first shape in a plan view, the substrate trace having a first end proximate the first substrate and a second end distal the first substrate, the first end having a greater width than the second end; and
   a metal ladder bump extending from an integrated circuit, the metal ladder bump having a second shape in the plan view, the second shape being different from the first shape, the metal ladder bump having a third end proximate the integrated circuit and a fourth end distal the integrated circuit, the third end having a greater width than the fourth end, the fourth end having a greater width than the second end,
   wherein the metal ladder bump and the substrate trace are physically and electrically coupled together through direct metal-to-metal bonds, an interface between the metal ladder bump and the substrate trace being free from solder, and
   wherein the substrate trace has a greater length than the metal ladder bump in a direction parallel to the major surface of the first substrate.

2. The device of claim 1, wherein the second shape is a quadrilateral.

3. The device of claim 1, wherein the second shape is a circle.

4. The device of claim 1, wherein the metal ladder bump and the substrate trace are copper, and wherein the interface between the metal ladder bump and the substrate trace is free from intermetallic compounds.

5. The device of claim 1 further comprising:
   a contact element on the integrated circuit;
   a dielectric layer on the contact element and the integrated circuit; and
   an under bump metallurgy (UBM) feature extending through the dielectric layer to couple the contact element,
   wherein the metal ladder bump is disposed on the UBM feature.

6. The device of claim 1, wherein the third end has a greater width than the first end.

7. The device of claim 1, wherein a ratio of a second width of the second end to a first width of the first end is between 0.75 and 0.97.

8. The device of claim 7, wherein a ratio of a fourth width of the fourth end to a third width of the third end is between 0.75 and 0.97.

9. The device of claim 1 further comprising an oxide layer extending along sidewalls of the metal ladder bump.

10. The device of claim 1, wherein a height of the substrate trace is less than a height of the metal ladder bump.

11. A device comprising:
   a first substrate;
   a trace extending along a major surface of the first substrate, the trace having a first length and a first width, the first width decreasing linearly along a first direction extending away from the first substrate;
   an integrated circuit chip; and
   a metal ladder bump extending from a major surface of the integrated circuit chip, the metal ladder bump having a second length and a second width, the first length being greater than the second length, the second width decreasing linearly along a second direction extending away from the integrated circuit chip, the second width being greater than the first width at an interface between the metal ladder bump and the trace, wherein the metal ladder bump and the trace are physically and electrically coupled together at the interface without solder.

12. The device of claim 11, wherein the integrated circuit chip comprises:
a second substrate;
a contact element on the major surface of the second substrate;
a first dielectric layer on the contact element and the major surface of the second substrate;
a second dielectric layer on the first dielectric layer; and
an under bump metallurgy (UBM) feature extending through the first dielectric layer and the second dielectric layer, the UBM feature being coupled to the contact element,
wherein the metal ladder bump is disposed on the UBM feature.

13. The device of claim 11 further comprising an oxide layer extending along sidewalls of the metal ladder bump.

14. The device of claim 11, wherein the metal ladder bump and the trace are copper.

15. The device of claim 11, wherein a height of the trace is less than a height of the metal ladder bump.

16. A device comprising:
a first substrate;
a trace extending along a major surface of the first substrate, the trace having a first tapering profile;
an integrated circuit; and
a metal ladder bump extending from a major surface of the integrated circuit, the metal ladder bump having a second tapering profile, the trace and the metal ladder bump being physically and electrically coupled together at a first interface, the first interface being free of solder, a width of the metal ladder bump being greater than a width of the trace at the first interface,
wherein the trace has a first length, the first length being measured along a first direction, the first direction being parallel to a longitudinal axis of the trace,
wherein the metal ladder bump has a second length, the second length being measured along the first direction, the first length being greater than the second length.

17. The device of claim 16, wherein the trace has a plan view shape that is symmetric around the longitudinal axis of the trace.

18. The device of claim 16, wherein the metal ladder bump and the trace are copper.

19. The device of claim 16 further comprising:
a contact element on the major surface of the integrated circuit;
a dielectric layer on the contact element and the major surface of the integrated circuit; and
an under bump metallurgy (UBM) feature extending through the dielectric layer to couple the contact element,
wherein the metal ladder bump is disposed on the UBM feature.

20. The device of claim 16 further comprising an oxide layer extending along sidewalls of the metal ladder bump.

* * * * *